(12) United States Patent
Li

(10) Patent No.: US 6,774,640 B2
(45) Date of Patent: Aug. 10, 2004

(54) TEST COUPON PATTERN DESIGN TO CONTROL MULTILAYER SAW SINGULATED PLASTIC BALL GRID ARRAY SUBSTRATE MIS-REGISTRATION

(75) Inventor: Jian-Jun Li, Singapore (SG)

(73) Assignee: St Assembly Test Services Pte Ltd., Singapore (SG)

( * ) Notice: Subject to any disclaimer, the term of this patent is extended or adjusted under 35 U.S.C. 154(b) by 21 days.

(21) Appl. No.: 10/224,151

(22) Filed: Aug. 20, 2002

(65) Prior Publication Data

US 2004/0036068 A1 Feb. 26, 2004

(51) Int. Cl.[7] .......................... G01N 27/00; H01L 23/58; H01L 21/66
(52) U.S. Cl. .............................. 324/557; 257/48; 438/18
(58) Field of Search .............................. 257/48; 438/10, 438/11, 17, 18, 14; 324/500, 512, 522, 523, 525, 526, 527, 531, 537, 557; 29/593

(56) References Cited

U.S. PATENT DOCUMENTS

| | | | |
|---|---|---|---|
| RE36,773 E | 7/2000 | Nomi et al. ................ 361/760 |
| 6,184,570 B1 | 2/2001 | MacDonald, Jr. et al. .. 257/622 |
| 6,249,045 B1 * | 6/2001 | Kresge et al. .............. 257/678 |
| 6,319,828 B1 | 11/2001 | Jeong et al. ................ 438/674 |
| 6,344,401 B1 | 2/2002 | Lam ........................... 438/460 |
| 6,391,669 B1 * | 5/2002 | Fasano et al. ................ 438/18 |

* cited by examiner

*Primary Examiner*—Evan Pert

(57) ABSTRACT

A new method is provided for evaluating the alignment of inner layers of interconnect layers. A test pattern is inserted within and as part of the process of creating a saw singulated plastic ball grid array substrate. The test pattern comprises a test point of reference for each inner layer of the substrate and multiple measurement points relating to the point of reference whereby each of these multiple measurement points is indicative of an amount of clearance or misalignment with respect to that inner-layer. By measuring electrical continuity or lack thereof between the point of reference and the respective multiple measurement points relating to the point of reference and by identifying which of the multiple points is shorted to the point of reference, the mis-alignment of the inner layers of the saw singulated plastic ball grid array substrate can be determined.

16 Claims, 2 Drawing Sheets

TEST COUPON PATTERN DESIGN TO CONTROL MULTILAYER SAW SINGULATED PLASTIC BALL GRID ARRAY SUBSTRATE MIS-REGISTRATION

BACKGROUND OF THE INVENTION (1) Field of the Invention

The invention relates to the fabrication of integrated circuit devices, and more particularly, to a method to detect occurrences of mis-registration or shift of respective inner-layers that are created in a substrate.

(2) Description of the Prior Art

The increasing need for creating more extensive and more complex semiconductor device interconnect traces has, as one potential solution led to the application of low resistance metals, such as copper, for the interconnect traces. Another approach to increase Input/Output (I/O) interconnect capability has been to design chips and chip packaging methods that offer dependable methods of increased interconnecting of chips at a reasonable manufacturing cost. This has led to the development of Flip Chip Packages.

Flip-chip technology uses bumps (typically comprising Pb/Sn solders) formed over aluminum contact pads on the semiconductor devices and interconnects the bumps directly to a packaging media, which are usually ceramic or plastic or organic material based. The flip-chip is bonded face down to the package medium through the shortest paths. These technologies can be applied not only to single-chip packaging, but also to higher levels of packaging, in which the packages are larger, and to more sophisticated substrates that have multiple layers of interconnect traces and that can accommodate several chips to form larger functional units.

The flip-chip technique, using an area I/O array, has the advantage of achieving a high density of interconnect to the device combined with a very low inductance interconnection to the package. The packaging substrate is generally used for Ball Grid Array (BGA) packages but can also be used for Land Grid Array (LGA) and Pin Grid Array (PGA) packages.

The mounting of a flip chip over the surface of a printed circuit board consists of attaching the flip chip to this board or to any other matching substrate. A flip chip is a semiconductor chip that has a pattern or array of terminals spaced around the active surface of the flip chip, the flip chip is mounted with the active surface of the flip chip facing the supporting substrate. Electrical connectors that are provided on the active surface of the flip chip can consist of Ball Grid Arrays (BGA) devices and Pin Grid Arrays (PGA) devices. With the BGA device, an array of minute solder balls is disposed over the active surface of the die for attachment to the surface of a supporting substrate. For PGA devices, an array of small pins extends essentially perpendicularly from the active surface of the flip chip, such that the pins conform to a specific arrangement on a printed circuit board or other supporting substrate for attachment thereto. The flip chip is bonded to the printed circuit board by refluxing the solder balls or pins of the flip chip.

With continuously decreasing semiconductor device dimensions and increasing device packaging densities, the packaging of semiconductor device continues to gain increased importance. Packaging of semiconductor devices in many instances makes use of supporting substrates over the surface of which one or more semiconductor devices are mounted. To meet requirements of device connectivity, the substrate over which the semiconductor devices are mounted typically contains multiple overlying layers of interconnect traces. The upper and lower surfaces of the supporting substrate are provided with contact pads for the connection of the surface mounted devices and for the provision of contact balls to the interconnect traces of the substrate. Via holes through the substrate connect contact pads of the upper and lower surfaces. For purposes of efficiency and cost considerations, substrates are typically created in working strip form that are larger than the single unit substrates that are required for individual device packages. These working strip forms are after completion subdivided by sawing the working strip into individual BGA packages. Miss-registration of the inner layers of multi-layer must be carefully controlled and monitored in order to avoid problems of electrical shorts after the sawing has been completed. The invention addresses this concern and provides a method of easily measuring offsets of inner-layers after the individual substrates have been created.

U.S. Pat. No. 6,344,401 B1 (Lam) shows a method for a sawed signulated die and BGA package.

U.S. Pat. No. RE 36773 (Nomi) shows a plating method for nested plating trace on substrates.

U.S. Pat. No. 6,319,828 B1 (Jeong) shows a CSP with copper traces.

U.S. Pat. No. 6,184,570 B1 (McDonald, Jr. et al.) shows a related patent.

SUMMARY OF THE INVENTION

A principle objective of the invention is to provide a method of detecting and monitoring inner-layer miss-registration of a multi-layer configuration.

Another objective of the invention is to provide a method for monitoring the accuracy of alignment of inner layers that are from of a substrate.

A new method is provided for evaluating the alignment of inner layers of interconnect layers. A test pattern is inserted within and as part of the process of creating a saw singulated plastic ball grid array substrate. The test pattern comprises a point of reference for each inner layer of the substrate and multiple measurement points relating to the point of reference whereby each of these multiple measurement points is indicative of different amount of clearance or misalignment between the outer and the inner layers. By measuring electrical continuity or lack thereof between the point of reference relating to each inner layer pattern and the respective multiple measurement points and by identifying which of the multiple points is shorted to the point of reference, the mis-alignment of the inner layers of the saw singulated plastic ball grid array substrate can be determined.

DESCRIPTION OF THE PREFERRED EMBODIMENTS

Figure 1:
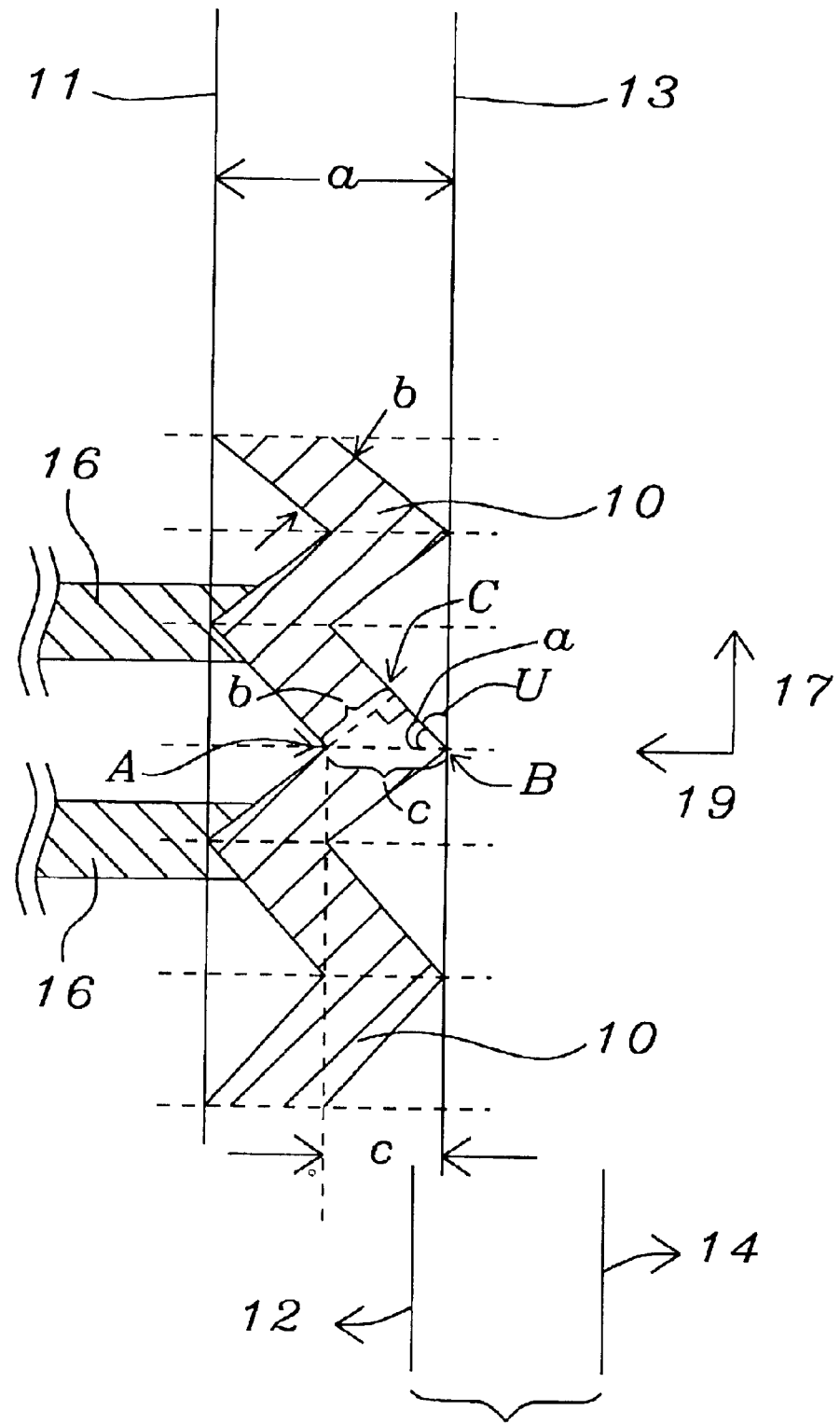
FIG. 1 is a top view of an inner layer plating area of a substrate that is used for the explanation of potential shorts that can occur after singulation of a working strip substrate.

The explanation of the invention starts with an explanation of the problem that is being tracked by the invention. For this purpose, FIG. 1 is used. The following comments apply to the invention.

Conventionally and preferably, plating traces and bars are provided for the purpose of connecting bonding fingers, ball pads and interconnections. This allows for required and ready electrical access to these solder-mask exposed areas for purposes of nickel and/or gold plating.

Due to the density of the traces that are provided in or over the surface of a substrate, a number of plating traces cannot be routed over top and bottom surfaces of the substrate but have to be routed at an inner layer of the substrate. The inner-layer traces are connected with each other at the time of the creation of the working strip. At the time that the working strip must be divided into individual BGA packages, these traces may in many instances have to be disconnected, which is part of the process of sub-dividing the working strip by sawing. The saw path, of which the position has been determined by an alignment guide on the outer layer, must therefor be accurately aligned with the traces that must be removed or interrupted. Any improper alignment between the inner layer and the outer layer, whereby the plating bar is either an inner ort an outer layer, that must be interrupted will result in incomplete removal of the traces and in these traces creating problems of electrical shorts in the separated BGA packages. By providing a test pattern that is part of the working strip, it is easy to detect the extent to which inner layers of traces have shifted from the desired position and therefore which individual BGA packages present potential problems of electrical shorts.

The concern of the required offset and the saw path is first explained. Shown in FIG. 1 for this purpose is a top view of a plating trace 10 that is to be interrupted by the saw path.

To further explain the concept represented by the top view of FIG. 1, the highlighted elements of this top view are:

10, is the trace that has been created in an inner layer of a substrate, this is the trace that must be interrupted by the saw path; the saw path is created by, as previously stated, sub-dividing a working strip into individual BGA packages 11 and 13, the boundaries of trace 10 in a direction 17 in which the saw path is created 12 and 14, the boundaries of the saw path in a case where the inner layer shifted 15, an arbitrarily selected saw path A, B and C are three corners of a rectangular triangle of which the angle at corner C is a ninety degree angle a, the width of trace 10 as measured in a direction that is perpendicular to the traveled saw path 17 b, the width of the trace 10 as measured in a direction that is perpendicular to the sides of trace 10 c, the distance that the saw path 15 must overly the width "a" of the trace 10 in order for the saw path the sever or interrupt the trace 10; this will become more clear in moving the saw path 15 from the position where it is located in the top view of FIG. 1 in a direction 19; saw path 15 will initially affect trace 10 starting at for instance angle B and all other points of trace 10 that make contact with border line 13; continued movement of saw path 15 in the direction 19 will cause increased removal of trace 10 from point B towards point A and all other equivalent points (not highlighted) of trace 10 until the point A (and all other equivalent points of trace 10) is reached and trace 10 is interrupted or cut; from this follows that "c" is the distance over which the saw path must "penetrate" the trace 10 so that trace 10 can be interrupted or cut by the saw path 15

Φ, the angle under which the trace 10 intersects with the saw path 15 or with the boundaries 11 and 13 of the trace 10.

In actual operation, the position of the saw path 17 is determined by the outer layer of the substrate, the saw path is moved as highlighted above to accommodate inner-layer shift or miss-registration.

Essentially using the indicated triangle ABC and applying basic trigonometry will teach that the following equation is valid: c=a−(b/cos Φ) whereby the value "c" is the maximum allowable shift of the layers of metal that are created at the time the trace 10 is created, that is the inner layer of metal traces, and taking into account that this inner layer metal was shifted in direction 19. This equation can be derived from the top view of FIG. 1, as follows: sin α=cos=b/c, from this follows that: c=a−b/cos Φ from which follows, observing the parameters that have been indicated in FIG. 1, that: c=a−(b/cos Φ). If this shift exceeds this value of "c" the saw path 15 cannot, as previously highlighted, completely cut through and disconnect trace 10, leaving trace 10 interconnected over parts thereof causing shorts within the separated individual BGA package.

For practical applications, the following value are typical and apply: a=250 μm, b=90 μm, Φ=45°.

Substituting these latter values in the above indicated equation leads to a value of 122 μm as the maximum allowable shift of the inner layer of interconnect traces in a direction 19 of FIG. 1. For purposes of clarifying this concept, two plating traces 16 have been highlighted in the top view of FIG. 1, these interconnect traces may, after the working strip has been separated into smaller, individual BGA packages, should no longer be connected with each other.

The above provided numerical values have been provided for purposes of illustration only.

A review of the relevant subject matter that has been discussed up to this point is as follows:

Individual BGA packages are created by singulation or sawing a larger substrate in strip form, the individual BGA packages are referred to as saw singulated plastic Ball Grid Array (BGA) packages BGA substrates and therefore singulated BGA packages comprise multiple layers of interconnect traces The trace patterns that are contained in inner layers of working strip substrates are interconnected before singulation The plating traces and bar that are part of the working strip substrates must be interrupted or disconnected at the time that the working strip substrates are sawed or singulated into individual BGA packages, and Traces of interconnect metal in inner layers of working strip substrates may not be properly aligned and may as a result not be completely separated or cut at the time of saw singulation; this has been shown using FIG. 1 of a top view of a plating trace.

The invention addresses the latter problem of inner layer plating traces that are not completely cut at the time of substrate singulation due to inner-layer miss-alignment or shift.

Figure 2:
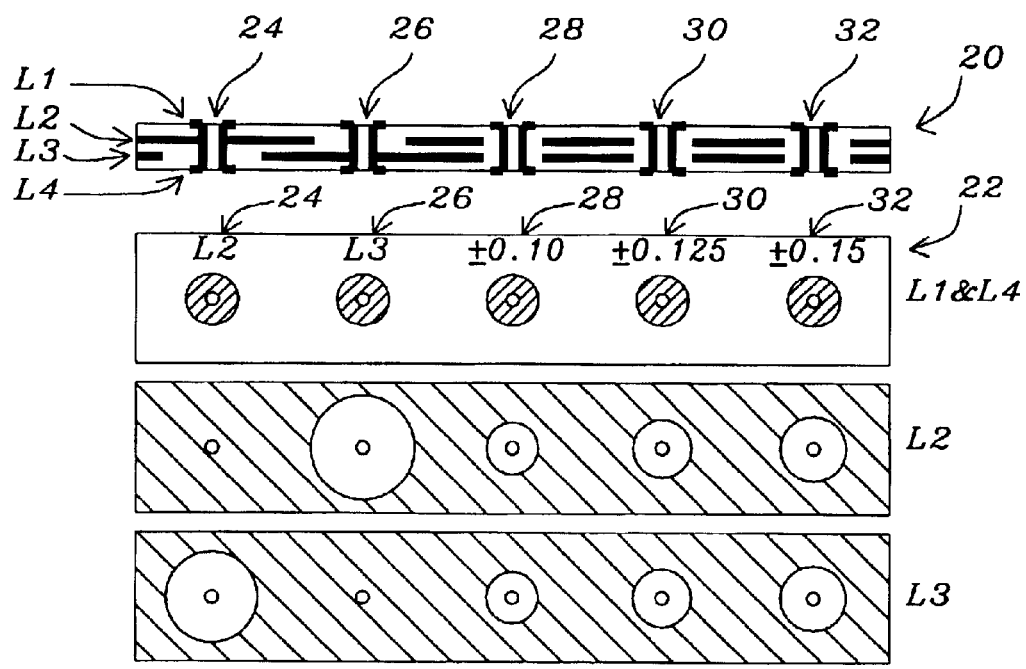
FIG. 2 is a cross section and top view of the test pattern of the invention.

The design pattern that is shown in FIG. 2 is the design of the invention wherein test points are created that are located at varying locations from a reference point.

Specifically, FIG. 2 shows a cross section 20 of a substrate comprising four layers L1, L2, L3 and L4 of interconnect metal and top view 22 of each of the four layers L1, L2, L3 and L4 of interconnect metal. It will be recognized from FIG. 2 that the layers L1 and L4 are identical and are via pads on the top and the bottom layer of substrate 20.

The spatial relationship between the test points 24, 26, 28, 30 and 32, as well as associated Plated Through Holes (PTH), that have been provided as forming the test pattern of the invention, a test pattern that is added to the existing design of the working strip, is as follows:

test point 24 is the first reference test point of the test pattern, further detail regarding test point 24 are provided below test point 26 is the second test point of the test pattern, further detail regarding test point 26 are provided below test point 28 has an inner-layer clearance of 100 μm from the PTH hole wall to the metal plane in layers 2 (L2) and 3 (L3)

test point 30 has an inner-layer clearance of 125 μm from the PTH hole wall to the metal plane in layers 2 (L2) and 3 (L3)

test point 32 has an inner-layer clearance of 150 μm from the PTH hole wall to the metal plane in layers 2 (L2) and 3 (L3).

The first reference point 24 and the second reference point 26 over the outer layers L1 and L4 should be viewed in combination with the metal that is provided in layers L2 and L3, as follows:

the first test point 24 is completely connected to and makes contact with metal of L2 as is shown in the cross section 20 and as shown in the top view 22 of L2;

the second test point 26 is completely connected to and makes contact with metal of L3 as is shown in the cross section 20 and as shown in the top view 22 of L3;

the first test point 24 and its PTH hole wall is far removed from and makes no contact with metal of L3 as is shown in the cross section 20 and as shown in the top view 22 of L3; and the second test point 26 and its PTH hole wall is far removed from and makes no contact with metal of L2 as is shown in the cross section 20 and as shown in the top view 22 of L2.

Test point 24, by being connected to the metal of L2, serves as a test point for L2 and is in this capacity used for measuring the off-set or mis-registration of layer L2.

Test point 26, by being connected to the metal of L3, serves as a contact point for L3 and is in this capacity used for measuring the off-set or mis-registration of layer L3.

As previously stated, PTH hole of test point 28 has an inner-layer clearance of 100 μm in layer 2 (L2) and layer 3 (L3). If therefore a shift in the inner layers L2 of 100 μm has occurred, the test point 28 is in contact with the shifted metal of L2 from which follows that an electrical short will be measured between test point 24 and 28.

As previously stated, the PTH hole wall of test point 28 has an inner-layer clearance of 100 μm on layer 3 (L3). If therefore a shift in the inner layers of L3 of more than 100 μm has occurred, the test point 28 is in contact with the shifted metal of L3 from which follows that there is an electrical short between test point 26 and 28.

The same reasoning applies to the test points 30 and 32, as follows:

PTH hole wall of test point 30 has an inner-layer clearance of 125 μm in layers 2 (L2)

PTH hole wall of test point 30 has an inner-layer clearance of 125 μm in layers 3 (L3)

PTH hole wall of test point 32 has an inner-layer clearance of 150 μm in layers 2 (L2)

PTH hole wall of test point 32 has an inner-layer clearance of 150 μm in layers 3 (L3)

If therefore a shift in the inner layers of L2 of more than 125 μm has occurred, the test point 30 is in contact with the metal of L2 from which follows that there electrical short can be measured between test point 30 and 24.

If therefore a shift in the inner layers of L3 of more than 125 μm has occurred, the test point 30 is in contact with the metal of L3 from which follows that an electrical short can be measured between test point 26 and 30.

If therefore a shift in the inner layers of L2 of more than 150 μm has occurred, the test point 32 is in contact with the metal of L2 from which follows that there electrical short can be measured between test point 24 and 32.

If therefore a shift in the inner layers of L3 of more than 150 μm has occurred, the test point 32 is in contact with the metal of L3 from which follows that an electrical short can be measured between test point 26 and 32.

In summary: the invention provides a reference or zero ground contact point that is connected with a layer that is evaluated for a shift of inner-layer traces. A number of subsequent test points is provided whereby each provided test point is located a certain distance from the reference test point. By measuring the presence of a short between the reference test point and one of the provided subsequent test points, the invention can estimate the amount of the shift or mis-registration that has occurred in the inner-layer that are associated with the reference test point.

By increasing the number of reference test points, it is clear that additional layers of a substrate can be evaluated for mis-registration. By further extending the number of additional test points, it is clear that the mis-registration of the inner layers of a substrate can be determined more accurately.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A substrate comprising:

a first reference point;

a second reference point spaced from the first reference point; and a first interconnect metal connected to the first reference point, the first interconnect metal having a through hole provided therein, the through hole normally surrounding the second reference point at a first distance with the first and second reference points being electrically unconnected, the first and second reference points being electrically connected when the first interconnect metal is displaced more than the first distance relative to the second reference point and contacts the second reference point.

2. The substrate as claimed in claim 1 further comprising:

further reference point spaced from the first reference point; and wherein:

the first interconnect metal has a further through hole provided therein, the further through hole normally surrounding the further reference point at a further distance with the first and further reference points electrically unconnected, the first and further reference points electrically connected when the first interconnect metal is displaced more than the further distance relative to the further reference point and contacts the further reference point.

3. The substrate as claimed in claim 1 further comprising:

a third reference point; and a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point.

4. The substrate as claimed in claim 1 further comprising:

third reference point; and a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point; and wherein:

the first interconnect metal has an additional through hole provided therein, the additional through hole surrounding the third reference point at an additional distance with the first and third reference point electrically unconnected, the first and third reference points remaining unconnected when the second interconnect metal is displaced more than the first distance.

5. A method comprising:

providing a substrate having a first reference point and a second reference point spaced from the first reference point; providing a first interconnect metal connected to the first reference point, the first interconnect metal having a through hole provided therein, the through hole normally surrounding the second reference point at a first distance with the first and second reference points being electrically unconnected, the first and second reference points being electrically connected when the first interconnect metal is displaced more than the first distance relative to the second reference point and contacts the second reference point;

determining from an electrical short between the first end second reference points that the first interconnect metal has been displaced more than the first distance; and determining from the lack of an electrical short between the first and second reference points that the first interconnect metal has been displaced less than the first distance.

6. The method as claimed in claim 5 wherein:

providing the substrate includes the substrate having a further reference point spaced from the first reference point; and providing the first interconnect metal includes the first interconnect metal having a further through hole provided therein, the further through hole normally surrounding the further reference paint at a further distance with the first and further reference points electrically unconnected, the first and further reference points electrically connected when the first interconnect metal is displaced more than the further distance relative to the further reference point and contacts the further reference point;

determining from an electrical short between the first and further reference points that the first interconnect metal has been displaced more than the further distance; and determining from the lack of an electrical short between the first and further reference points that the first interconnect metal has been displaced less than the further distance.

7. The method as claimed in claim 5 wherein:

providing the substrates includes the substrate having a third reference point; and further comprising:

providing a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point;

determining from an electrical short between the second and third reference points that the second interconnect metal has been displaced more than the first distance; and determining from the lack of an electrical short between the second and third reference points that the second interconnect metal has been displaced less than the first distance.

8. The method as claimed in claim 5 further comprising:

providing the substrates includes the substrate having a third reference point; and further comprising:

providing a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point;

determining from an electrical short between the second and third reference points that the second interconnect metal has been displaced more than the first distance; and determining from the lack of an electrical short between the second and third reference points that the second interconnect metal has been displaced less than the first distance;

wherein:

providing the first interconnect metal provides the first inter connect metal having an additional through hole provided therein, the additional through hole surrounding the third reference point at an additional distance with the first and third reference point electrically unconnected, the first and third reference points remaining unconnected when the second interconnect metal is displaced more than the first distance.

9. A substrate comprising:
a first reference point and a second reference point spaced from the first reference point;
a first interconnect metal connected to the first reference point, the first interconnect metal having a through hole provided therein, the through hole normally surrounding the second reference point at a first distance with the first and second reference points being electrically unconnected, the first and second reference points being electrically connected when the first interconnect metal is displaced more than the first distance relative to the second reference point and contacts the second reference point; and
a first set of interconnect traces respectively positioned in a fixed relationship to the first interconnect metal whereby displacement of the first set of interconnect traces can be measured with respect to the second reference point.

10. The substrate as claimed in claim 9 further comprising:
a further reference point spaced from the first reference point; and
wherein:
the first interconnect metal has a further through hole provided therein, the further through hole normally surrounding the further reference point at a further distance with the first and further reference points electrically unconnected, the first and further reference points electrically connected when the first interconnect metal is displaced more than the further distance relative to the further reference point and contacts the further reference point, the further distance greater than the first distance, whereby displacement of the first set of interconnect traces can be measured with respect to the further reference point.

11. The substrate as claimed in claim 9 further comprising:
a third reference point;
a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point; and
a second set of interconnect traces respectively positioned in a fixed relationship to the second interconnect metal whereby displacement of the first and second sets of interconnect traces relative to each other can be measured.

12. The substrate as claimed in claim 9 further comprising:
a third reference point;
a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point; and
a second set of interconnect truce respectively positioned in a fixed relationship to the second interconnect metal;
wherein:
the first interconnect metal has an additional through hole provided therein, the additional through hole surrounding the third reference point at an additional distance with the first and third reference point electrically unconnected, the first and third reference points remaining unconnected when the second interconnect metal is displaced more than the first distance, whereby displacement of the first and second sets of interconnect traces relative to each other can be measured.

13. A method comprising:
providing a substrate having a first reference point and a second reference point spaced from the first reference point;
providing a first interconnect metal connected to the first reference point, the first interconnect metal having a through hole provided therein, the through hole normally surrounding the second reference point at a first distance with the first and second reference points being electrically unconnected, the first and second reference points being electrically connected when the first interconnect metal is displaced more than the first distance relative to the second reference point and contacts the second reference point;
providing a first set of interconnect traces respectively positioned in a fixed relationship to the first interconnect metal;
determining from an electrical short between the first and second reference points that the first interconnect metal has been displaced more than the first distance;
determining from the lack of an electrical short between the first and second reference points that the first interconnect metal has been displaced less than the first distance; and
measuring displacement of the first set of interconnect traces with respect to the second reference point by the electrical short or the lack thereof.

14. The method as claimed in claim 13 wherein:
providing the substrate includes the substrate having a further reference point spaced from the first reference point; and
providing the first interconnect metal includes the first interconnect metal having a further through hole provided therein, the further through bole normally surrounding the further reference point at a further distance with the first and further reference points electrically unconnected, the first and further reference points electrically connected when the first interconnect metal is displaced more than the further distance relative to the further reference point and contacts the further reference point;
determining from an electrical short between the first and further reference points that the first interconnect metal has been displaced more than the first distance;
determining from the lack of an electrical short between the first and further reference points that the first interconnect metal has been displaced less than the first distance; and
measuring displacement of the first set of interconnect traces with respect to the further reference point by electrical shorts or the lack thereof.

15. The method as claimed in claim 13 wherein:
  providing the substrates includes the substrate axing a third reference point; and
  further comprising:
    providing a second interconnect metal connected to the third reference point, the second interconnect metal having a through hole provided therein, the through hole normally surrounding the second reference point at th first distance with the second and third reference points electrically unconnected, the second and third reference points electrically connected when the second interconnect metal is displaced more than the first distance relative to the second reference point and contacts the second reference point;
    providing a second set of interconnect traces respectively positioned in a fixed relationship to the second interconnect metal;
    determining from an electrical short between the second and third reference points that the second interconnect metal has been displaced more than the first distance; and
    determining from the lack of an electrical short between the second and third reference points that the second interconnect metal has been displaced less than the first distance; and
    measuring displacement of the first and second sets of interconnect traces relative to each other by electrical shorts or the lack thereof.

16. The method as claimed in claim 13 further comprising:
  providing the substrates includes the substrate having a third reference point; and
  further comprising:
    providing a second interconnect metal connected to the third reference point, the second interconnect metal having a through hole provided therein, the through hole normally surrounding the second reference point at the first distance with the second and third reference points electrically unconnected, the second and third reference points electrically connected when the second interconnect metal is displaced more than the first distance relative to the second reference point and contacts the second reference point;
    providing a second set of interconnect traces respectively positioned in a fixed relationship to the second interconnect metal;
    determining from an electrical short between the second and third reference points that the second interconnect metal has been displaced more than the first distance;
    determining from the lack of an electrical short between the second and third reference points chat the second interconnect rental has been displaced less than the first distance; and
    measuring displacement of the first and second sets of interconnect traces relative to each other by electrical shorts or the lack thereof; and
  wherein:
    providing the first interconnect metal provides the first inter connect metal having an additional through hole provided therein, the additional through hole surrounding the third reference point at an additional distance with the first and third reference point electrically unconnected, the first and third reference points remaining unconnected when the second interconnect metal is displaced more than the first distance.

* * * * *

UNITED STATES PATENT AND TRADEMARK OFFICE
CERTIFICATE OF CORRECTION

PATENT NO. : 6,774,640 B2
DATED : August 10, 2004
INVENTOR(S) : Li

It is certified that error appears in the above-identified patent and that said Letters Patent is hereby corrected as shown below:

Column 6,
Line 56, insert -- a -- before "further"

Column 7,
Line 14, insert -- a -- before "third"
Line 38, insert a -- ¶ (carriage return) -- before "providing"
Line 48, delete "end" and insert therefor -- and --
Line 63, delete "paint" and insert therefor -- point --

Column 10,
Line 3, delete "truce" and insert therefor -- traces --
Line 50, delete "bole" and insert therefor -- hole --

Column 11,
Line 2, delete "axing" and insert therefor -- having --
Line 9, delete "th" and insert therefor -- the --

Column 12,
Line 19, delete "chat" and insert therefor -- that --
Line 20, delete "rental" and insert therefor -- metal --

Signed and Sealed this

Eighth Day of February, 2005

JON W. DUDAS
*Director of the United States Patent and Trademark Office*